(12) United States Patent
Kuo et al.

(10) Patent No.: US 9,123,730 B2
(45) Date of Patent: *Sep. 1, 2015

(54) SEMICONDUCTOR DEVICE HAVING THROUGH SILICON TRENCH SHIELDING STRUCTURE SURROUNDING RF CIRCUIT

(71) Applicant: UNITED MICROELECTRONICS CORP., Hsin-Chu (TW)

(72) Inventors: Chien-Li Kuo, Hsinchu (TW);
Yung-Chang Lin, Taichung (TW);
Ming-Tse Lin, Hsinchu (TW);
Kuei-Sheng Wu, Miaoli County (TW);
Chia-Fang Lin, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/939,184

(22) Filed: Jul. 11, 2013

(65) Prior Publication Data

US 2015/0014828 A1    Jan. 15, 2015

(51) Int. Cl.
*H01L 23/552* (2006.01)
*H01L 23/58* (2006.01)
*H01L 23/00* (2006.01)
(Continued)

(52) U.S. Cl.
CPC ............ *H01L 23/552* (2013.01); *H01L 23/585* (2013.01); *H01L 23/481* (2013.01); *H01L 23/66* (2013.01); *H01L 24/13* (2013.01); *H01L 24/16* (2013.01); *H01L 24/32* (2013.01); *H01L 24/48* (2013.01); *H01L 24/73* (2013.01); *H01L 2224/0401* (2013.01); *H01L 2224/04042* (2013.01); *H01L 2224/131* (2013.01); *H01L 2224/16225* (2013.01); *H01L 2224/32225* (2013.01); *H01L 2224/48091* (2013.01); *H01L 2224/73265* (2013.01); *H01L 2224/94* (2013.01); *H01L 2924/1421* (2013.01); *H01L 2924/15311* (2013.01)

(58) Field of Classification Search
CPC ........................... H01L 23/552; H01L 23/585
USPC .......................... 438/667; 257/659, E23.114
See application file for complete search history.

(56) References Cited

U.S. PATENT DOCUMENTS 3,150,299 A    9/1964 Noyce
3,256,465 A    6/1966 Weissenstem
(Continued)

OTHER PUBLICATIONS

Uemura et al., Isolation Techniques Against Substrate Noise Coupling Utilizing Through Silicon Via (TSV) Process for RF/Mixed-Signal SoCs, Solid-State Circuits, IEEE Journal of (vol. 47 , Issue: 4 ) pp. 810-816, Apr. 2012.

*Primary Examiner* — Mohammad Islam
*Assistant Examiner* — John P Dulka
(74) *Attorney, Agent, or Firm* — Winston Hsu; Scott Margo

(57) ABSTRACT

The present invention provides a semiconductor device with a shielding structure. The semiconductor device includes a substrate, an RF circuit, a shielding structure and an interconnection system. The substrate includes an active side and a back side. The RF circuit is disposed on the active side of the substrate. The shielding structure is disposed on the active side and encompasses the RF circuit. The shielding structure is grounded. The shielding structure includes a shielding TST which does not penetrate through the substrate. The interconnection system is disposed on the active side of the substrate. The interconnection system includes a connection unit providing a signal to the RF circuit.

19 Claims, 9 Drawing Sheets

(51) Int. Cl.
*H01L 23/48* (2006.01)
*H01L 23/66* (2006.01)

(56) References Cited

U.S. PATENT DOCUMENTS

| | | | |
|---|---|---|---|
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,309,956 B1 | 10/2001 | Chiang |
| 6,391,777 B1 | 5/2002 | Chen |
| 6,407,002 B1 | 6/2002 | Lin |
| 6,429,502 B1 | 8/2002 | Librizzi |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Estes et al. |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,564,115 B2 | 7/2009 | Chen |
| 7,598,607 B2 | 10/2009 | Chung |
| 7,633,165 B2 | 12/2009 | Hsu |
| 7,651,889 B2 | 1/2010 | Tang |
| 7,732,926 B2 | 6/2010 | Uchiyama |
| 7,795,735 B2 | 9/2010 | Hsu |
| 7,812,426 B2 | 10/2010 | Peng |
| 7,816,227 B2 | 10/2010 | Chen |
| 7,825,024 B2 | 11/2010 | Lin |
| 7,825,517 B2 | 11/2010 | Su |
| 7,843,064 B2 | 11/2010 | Kuo |
| 7,846,837 B2 | 12/2010 | Kuo |
| 7,851,346 B2 | 12/2010 | Lee |
| 7,880,193 B2 | 2/2011 | Lam |
| 7,928,534 B2 | 4/2011 | Hsu |
| 7,932,608 B2 | 4/2011 | Tseng |
| 7,939,941 B2 | 5/2011 | Chiou |
| 7,955,895 B2 | 6/2011 | Yang |
| 7,956,442 B2 | 6/2011 | Hsu |
| 7,969,013 B2 | 6/2011 | Chen |
| 7,999,358 B2 | 8/2011 | Bakalski |
| 8,026,592 B2 | 9/2011 | Yoon |
| 8,034,708 B2 | 10/2011 | Kuo |
| 8,049,327 B2 | 11/2011 | Kuo |
| 8,053,873 B2 | 11/2011 | Chauhan |
| 8,053,898 B2 | 11/2011 | Marcoux |
| 8,053,900 B2 | 11/2011 | Yu |
| 8,053,902 B2 | 11/2011 | Chen |
| 8,063,496 B2 | 11/2011 | Cheon |
| 8,169,059 B2 | 5/2012 | Barth |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0085172 A1* | 4/2007 | Hsu ................ 257/659 |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0140749 A1* | 6/2010 | Kuo ................ 257/621 |
| 2010/0140772 A1 | 6/2010 | Lin |
| 2010/0244247 A1 | 9/2010 | Chang |
| 2010/0323478 A1 | 12/2010 | Kuo |
| 2011/0201175 A1* | 8/2011 | Barth et al. ........... 438/454 |
| 2012/0273926 A1* | 11/2012 | Pagaila ............. 257/659 |
| 2012/0280357 A1 | 11/2012 | Wang |

* cited by examiner

SEMICONDUCTOR DEVICE HAVING THROUGH SILICON TRENCH SHIELDING STRUCTURE SURROUNDING RF CIRCUIT

BACKGROUND OF THE INVENTION

1. Field of the Invention

The present invention relates to a semiconductor device having a shield structure, and more particularly, to a semiconductor device having a shield structure that can reduce the electromagnetic interference (EMI).

2. Description of the Prior Art

In modern society, the micro-processor system comprised of integrated circuits (IC) is a ubiquitous device, being utilized in such diverse fields as automatic control electronics, mobile communication devices and personal computers. With the development of technology and the increasingly imaginative applications of electrical products, the IC device is becoming smaller, more delicate and more diversified.

As is well known in the art, an IC device is produced from dies that are fabricated by conventional semiconductor manufacturing processes. The process to manufacture a die starts with a wafer: first, different regions are marked on the wafer; second, conventional semiconductor manufacture processes such as deposition, photolithography, etching or planarization are used to form needed circuit trace(s); then, each region of the wafer is separated to form a die and packaged to form a chip; finally, the chip is attached onto a board, for example, a printed circuit board (PCB), and the chip is electrically coupled to the pins on the PCB. Thus, each of the programs on the chip can be performed, thereby forming a package body.

In the modern society, current semiconductor devices often include RF circuit to perform wireless communication capabilities. However, there is often strong EMI generated by the RF circuit, which would interfere other around circuits. It is a serious problem which is urged to be resolved.

SUMMARY OF THE INVENTION

The present invention therefore provides a semiconductor device having a shield structure, which can avoid the EMI problem.

According to one embodiment, the present invention provides a semiconductor device having a shielding structure. The semiconductor device includes a substrate, an RF circuit, a shielding structure and an interconnection system. The substrate includes an active surface and a back surface. The RF circuit is disposed on the active surface of the substrate. The shielding structure is disposed on the active surface and encompasses the RF circuit. The shielding structure is grounded. The shielding structure includes a shielding through silicon trench (TST) which does not penetrate through the substrate. The interconnection system is disposed on the active surface of the substrate. The interconnection system includes a connection unit providing a signal to the RF circuit.

According to another embodiment, the present embodiment provides a semiconductor device having a shielding structure. The semiconductor device includes a substrate, an RF circuit, a shielding structure and a through silicon via (TSV) for connection. The substrate sequentially has a back surface, a base material, an insulation layer, a semiconductor layer and an active surface. The RF circuit is disposed in the semiconductor layer. The shielding structure is disposed at least in the semiconductor layer, wherein the shielding structure encompasses the RF circuit and is grounded, and the shielding structure comprises a TST, which penetrates through the semiconductor layer but does extend into the insulation layer. The TSV for connection penetrates through the substrate, wherein the TSV for connection provides a voltage signal to the RF circuit.

The present invention provides a semiconductor device having a shielding structure, which can effectively eliminate the phenomenon of EMI from the RF circuits. The present invention further provides a variety of embodiments by incorporation into other TSV and SOI substrate.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
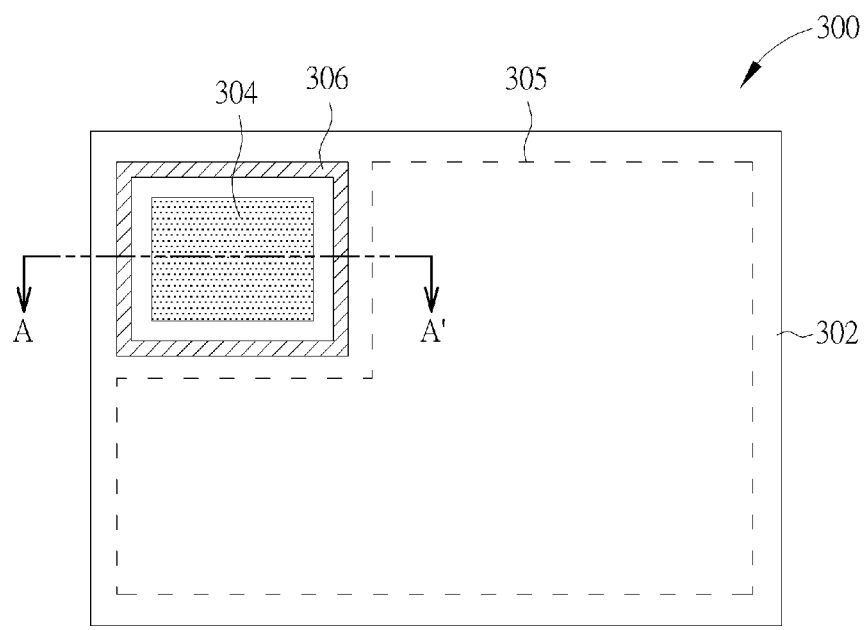
FIG. 1 and FIG. 2 show schematic diagrams of the semiconductor structure having a shielding structure according to one embodiment of the present invention.
Figure 2:
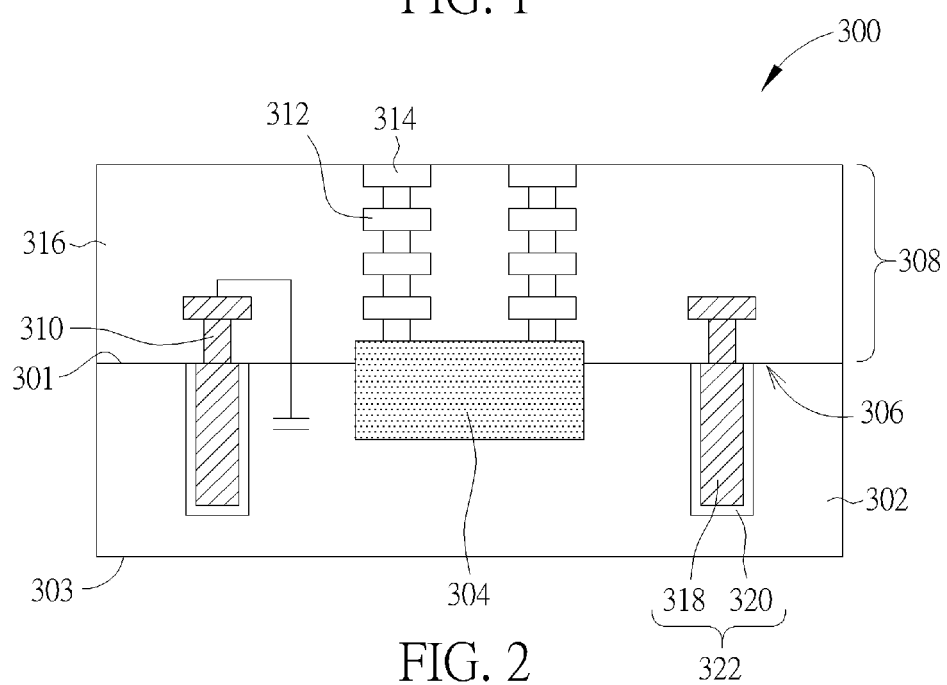

Please refer to FIG. 1 and FIG. 2, which show schematic diagrams of the semiconductor device having a shield structure according to one embodiment of the present invention, wherein FIG. 2 is a cross sectional view taken along line AA' in FIG. 1. The semiconductor device in the present embodiment is, for example, a chip 300. The chip 300 has a substrate 302, a radio frequency (RF) circuit 304, a plurality of dielectric layers 316, a shielding structure 306 and a metal interconnection system 308.

The substrate 302 includes a semiconductor material. For example, the substrate 302 can be a silicon substrate, an epitaxial silicon substrate, a silicon germanium substrate or a silicon carbide substrates. The substrate 302 has an active surface 301 and a back surface 303, which are disposed opposite to each other.

As shown in the top view of FIG. 1, in comparison to other circuit 305, the RF circuit 304 preferably is disposed close to an edge of the chip 300, preferably to a corner of the chip 300. Specifically, there is no other active circuit 305 disposed between the edge of the chip 300 and RF circuit 304 except other electrostatic discharge protection (ESD protection) devices. As shown in the cross sectional view of FIG. 2, the RF circuit 304 is disposed in/on the substrate 302 at the side of the active surface 301. In the present invention, the RF circuit 304 refers to the circuits that are able to send or receive radio waves of a certain frequency, for example, 1900M Hz to 900M Hz used in mobile communication circuit, or 2.4G Hz used in a Bluetooth communication circuit, or 6 G Hz used in other communication system. The RF circuit 304 may include a plurality of active or passive electronic components (not shown).

The dielectric layers 316 are disposed on the substrate 302 at the side of the active surface 301. The dielectric layer 316 can contain multiple layers of the same or different dielectric materials, such as silicon oxide ($SiO_2$), tetraethyl orthosilicate (TEOS), plasma-enhanced-tetraethyl orthosilicate (PETEOS), porous sol-gel, or other low k materials, and is not limited thereto.

The metal interconnect system 308 is disposed in the dielectric layer 316 and can be formed by different conventional metal interconnection forming processes, such as an aluminum process, a via plug process, a Cu damascene process or a combination thereof. In one embodiment, the metal interconnection system 308 includes at least a connection unit 312, a shielding unit 310, and a contact pad 314. The connection unit 312 connects the contact pad 314 upwardly and connects the RF circuit 304 downwardly. The contact pads 314 are connected to a voltage signal (not shown) to provide various functions for the RF circuit 304. For example, the voltage signal can be an input/output signal or a driving power.

The shielding structure 306 is disposed in the substrate 302 and encompasses the RF circuit 304. In one embodiment of the present invention, the shielding structure 306 includes a shielding through silicon trench (TST) 322 and an optionally shielding unit 310. The shielding unit 310 is a part of the metal interconnection system 308, which means that the shielding unit 310 and the connection unit 312 can be formed by the same forming method and in the same processes. However, the shielding unit 310 does not electrically connect the connection unit 312. In one embodiment of the present invention, the shielding unit 310 directly contacts the shielding TST 322. In another embodiment, the shielding unit 310 does not electrically connect any circuit and is electrically floating. In other embodiments, the shielding unit 310 can be omitted. In one embodiment, the shielding structure 306 is grounded. For example, the shielding structure 306 is connected to the shielding unit 310 which is further connected to a pad (not shown) for grounding. Alternatively, the shielding structure 306 is connected other connecting unit for grounding.

Figure 3:
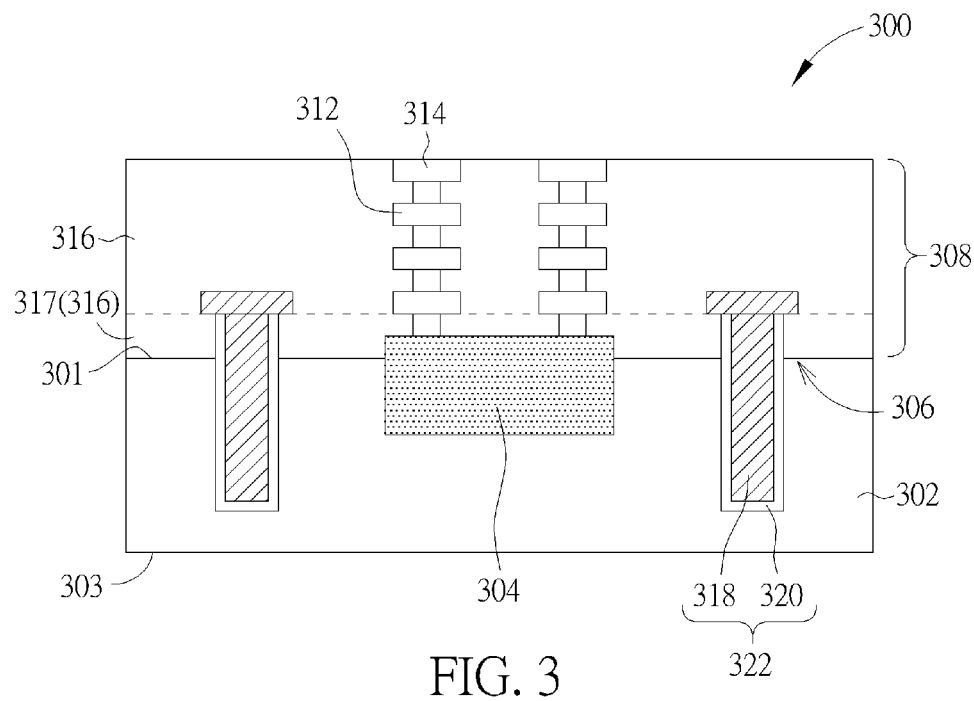
FIG. 3 to FIG. 10 show schematic diagrams of the semiconductor structure having a shielding structure according to other embodiments of the present invention.

The shielding TST 322 is disposed in the substrate 302 and includes an insulation layer 320 and a conductive layer 318, wherein the insulation layer 320 is disposed between the conductive layer 318 and the substrate 302. In one embodiment, the insulation layer 320 includes silicon dioxide, and the conductive layer 318 includes a metal such as copper. In another embodiment, the shielding TST 322 can contain other layer such as a barrier layer formed of TiN (not shown), which is disposed between the insulation layer 320 and the conductive layer 318. As shown in the cross-sectional view in FIG. 2, the shielding TST 322 does not penetrate through the substrate 302, that is, the shielding TST 322 only extends to the active surface 301 but does not extend to the back surface 303. Preferably, the shielding TST 322 has a depth greater than that of the RF circuit 304. In one embodiment, the depth of the shielding TST 322 is between 50 microns and 100 microns. In another embodiment, by using different manufacturing method, the shielding TST 322 can extend to the dielectric layer 316. As shown in FIG. 3, the shielding TST 322 further extend to a inter-dielectric (ILD) layer 317 in the dielectric layer 316.

Figure 4:
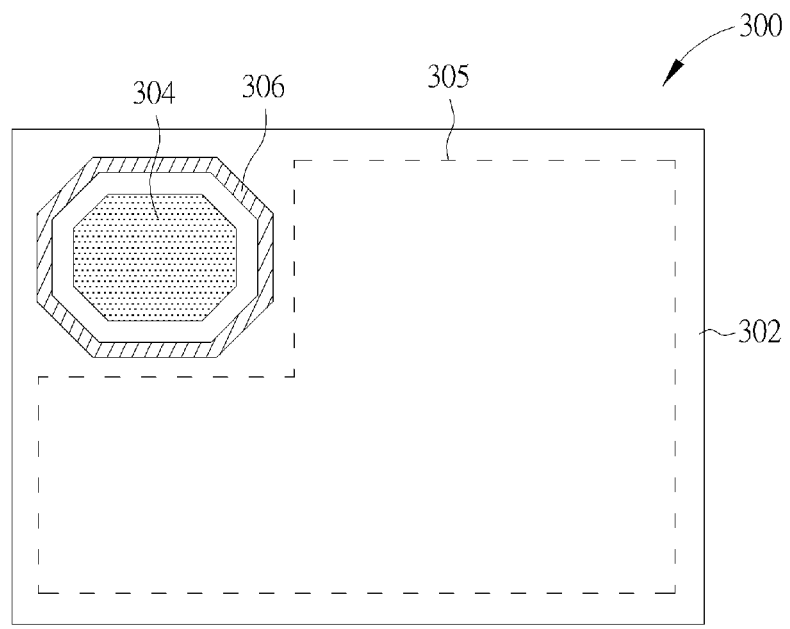
Figure 5:
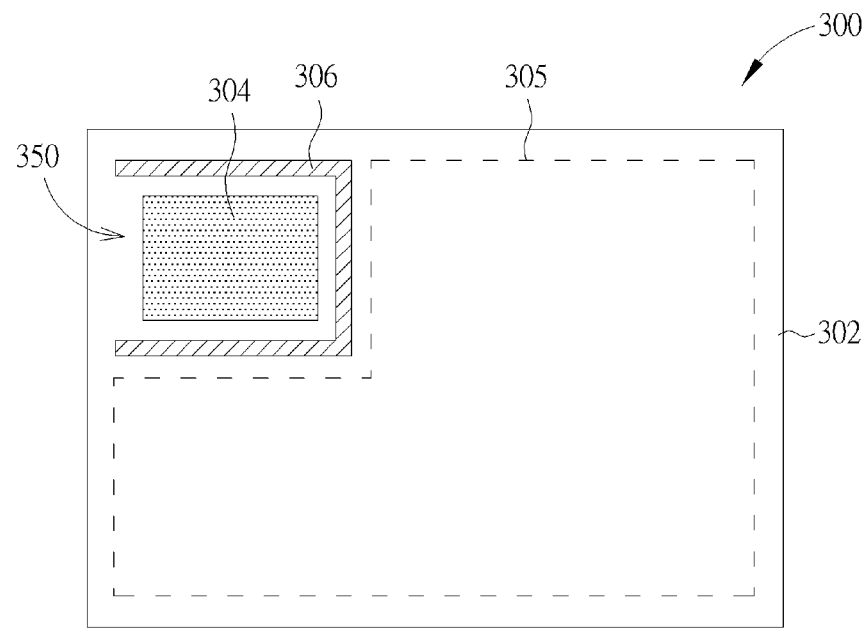
Figure 6:
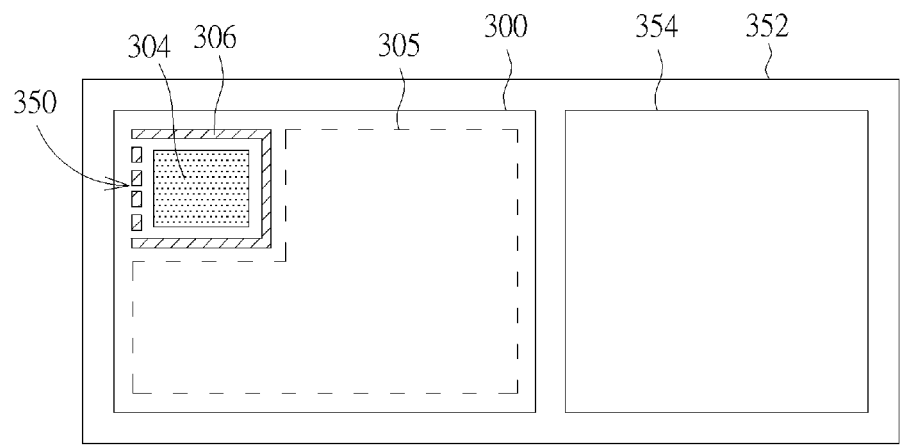

The shielding structure 306 of the present invention may have different embodiments. As shown in the top view of FIG. 1, the layout of the shielding structure can be a closed rectangular which completely surrounds the RF circuit 304. As shown in FIG. 4, when the RF circuit 304 is an octagon, the layout of the shielding structure 306 can correspondingly be a closed octagon. In another embodiment, the layout of the shielding structure 306 can be other closed polygon such as a hexagon or a circle. In another embodiment, the shielding structure 306 does not completely encompass the RF circuit 304 and may be a polygon having an opening. As shown in the top view of FIG. 5, the layout of the shielding structure 306 is a U-shape having an opening 350, where there is no other active circuit 305 facing the opening 350. For example, when the RF circuit 304 is disposed at the edge of the chip 300, the opening 350 preferably faces the edge of the chip 300 and there is no other active circuit 350 between the edge of the chip 300 and the opening 350 (except other ESD protection devices). In another embodiment, the shielding structure 306 may have more than one opening 350 thereby forming an L-shape. In another embodiment, as shown in FIG. 6, when the chip 300 and other chip 354 is packaged into a package body 352, the opening 350 preferably faces the edge of the package body 352 and there is no other chip 354 between the edge of the package body 352 and the opening 350 (except other ESD protection devices). In still another embodiment, as shown in FIG. 6, a discontinuous shielding structure 306 can be disposed in the opening 350. It should be noted that the foregoing embodiments of the shielding structure 306 are mainly referred to the shielding TST 322 of the shielding structure 322. In one preferable embodiment, the layout of the shielding TST 322 is the same as that of the shielding unit 310. However, according to the design of the product, the layouts thereof can be different.

Figure 7:
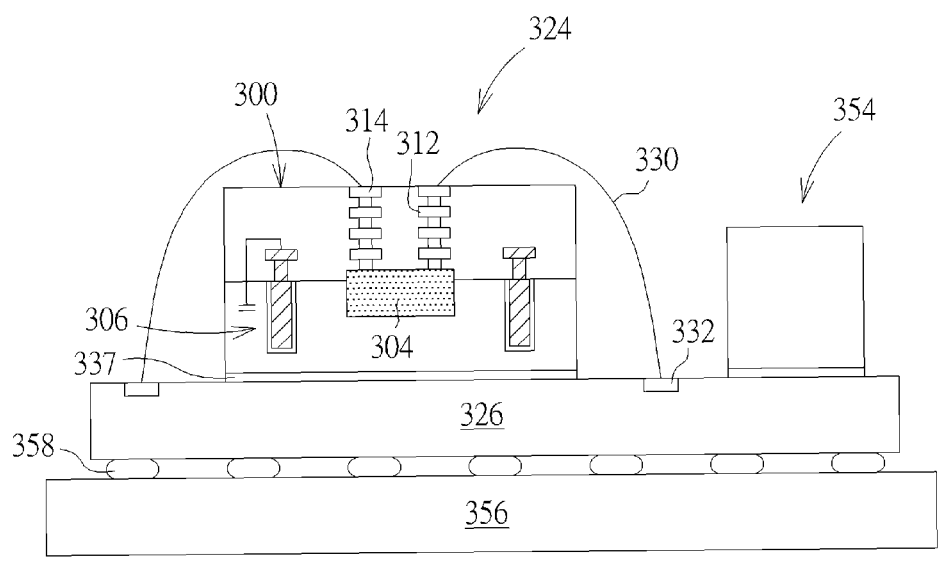

By using the aforementioned embodiments of the shielding structure 306, the EMI generated by the RF circuit 304 can be reduced so the performance of the RF circuit 304 or other circuit 305 can be ensured. It is characterized in the present invention that the shielding structure 306 belongs to the wafer level instead of the package level. That is, the shielding structure 306 is formed by general semiconductor manufacturing processes such as TSV forming processes or metal interconnect forming process, and the chip 300 is not encapsulated or packaged before forming the shielding structure 306. Please refer to FIG. 7, showing a schematic diagram of the semiconductor structure having shielding structure in the package body. As shown in FIG. 7, the package body 324 of the present embodiment includes the chip 300 in FIG. 2, a base board 326, an optional chip 354 and a board 356. In one embodiment, the chip 300 is attached to the base board 326 by an adhesive 337. The contact pad 314 of the chip 300 is electrically connected to a contact pad 332 of the base board 326 by a wire 330, so the base board 326 can provide the voltage signal to the RF circuit 304. The shielding structure 306 is grounded and is not connected to the voltage signal. In one embodiment, the base board 326 can be a silicon interposer, a multi-layered board or another chip. The board 356, such as a printed circuit board (PCB) is connected to the base board 326 by a connecting circuit 358.

Figure 8:
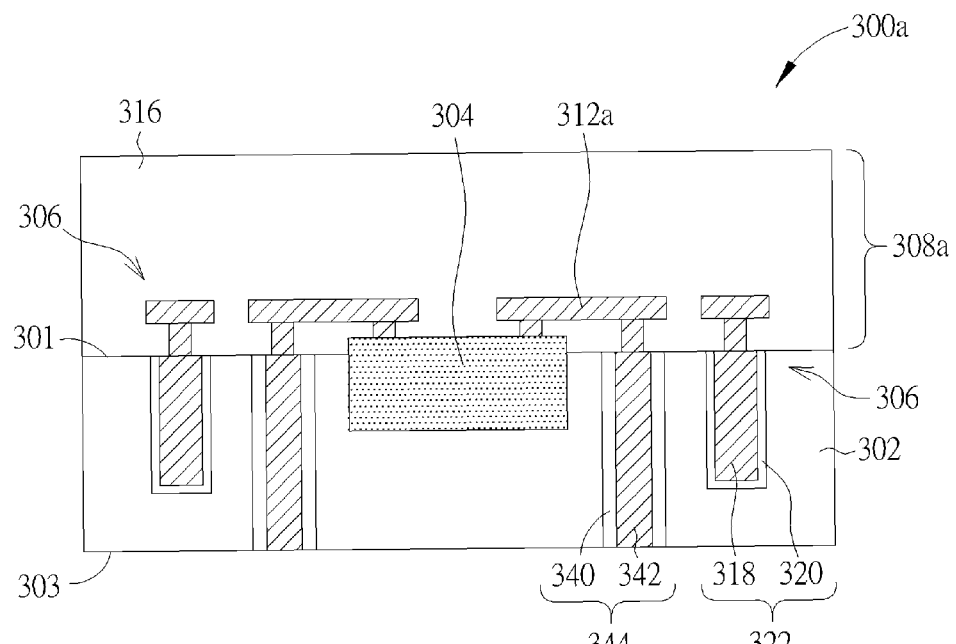

It is understood that besides the wire bonding in the aforementioned embodiment, other package method can be used in the present invention, such as solder bump, redistribution layer (RDL), which can be further incorporated into various techniques such as flip chip, ball grid array (BGA) package to form the package body. In another embodiment, another TSV can be used to provide the voltage signal. Please refer to FIG. 8, which shows a schematic diagram of the semiconductor structure having a shielding structure according to one embodiment of the present invention. For the sake of simplicity, same reference numerals are used to refer to the same or similar components in the following embodiments. As shown in FIG. 8, the semiconductor device of this embodiment is a chip 300a, which includes a substrate 302, an RF circuit 304, a shielding structure 306 and a metal interconnect system 308a. In this embodiment, the RF circuit 304 is connected to a TSV for connection 344 by the connection unit 312a in the metal interconnection system 308a. Therefore, the TSV for connection 344 can provides the voltage signal to the RF circuit 304, and the shielding structure 306 is grounded to provide shielding function for RF circuit 304. The TSV 344 and TST 322 can have different embodiments. In one embodiment, the TSV for connection 344 that provides the voltage signal penetrates through the active surface 301 and the back surface 303 of the substrate 302 while the shielding TST 322 that provides the shielding function does not penetrate the substrate 302. In another embodiment, a ratio of the thickness of a conductive layer 342 in the TSV for connection 344 to the width of the TSV for connection 344 is less than that of the thickness of the conductive layer 318 in the shielding TST 322 to the width of the shielding TST 322. That is, when the widths of the TSV for connection 344 and the shielding TST 322 are the same, the conductive layer 342 is thinner than the conductive layer 344 and the insulation layer 340 is thicker than the insulation layer 320.

Figure 9:
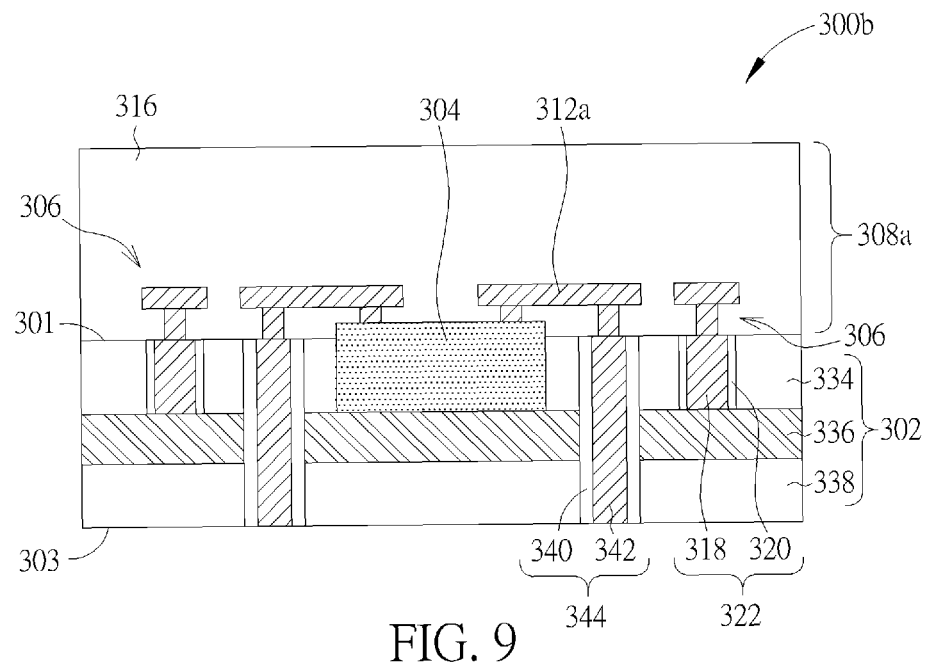

Please refer to FIG. 9, which shows a schematic diagram of the semiconductor structure having a shielding structure according to one embodiment of the present invention. In another embodiment, the semiconductor device having a shield structure can be applied to a silicon-on-insulator (SOI) substrate. As shown in FIG. 8, the substrate 302 in the present embodiment is an SOI substrate, which in sequence includes a base layer 338, an insulation layer 336 and a semiconductor layer 334. In this embodiment, the TSV for connection 344 penetrates through the substrate 302, including the base layer 338, the insulation layer 336 and the semiconductor layer 334, while the shielding TST 322 is disposed in the semiconductor layer 334 and does not extend to the insulation layer 336. In one embodiment, the base material 338 is a semiconductor material, the insulation layer 336 is silicon dioxide, and the semiconductor layer 334 is silicon. In another embodiment, the base layer 338 may be a non-semiconductor material such as ceramic, glass or sapphire. The insulation layer 336 may be a variety of organic or inorganic material, while the organic material can be benzocyclobutane (BCB), cycloolefin, polyimide, polyamide, polyester, polyalcohol, poly(ethylene oxide), polyphenylene, polyether or polyketone or other resins, and the inorganic material can be silicon oxide, silicon nitride, silicon oxynitride, silicon carbide or alumina.

Figure 10:
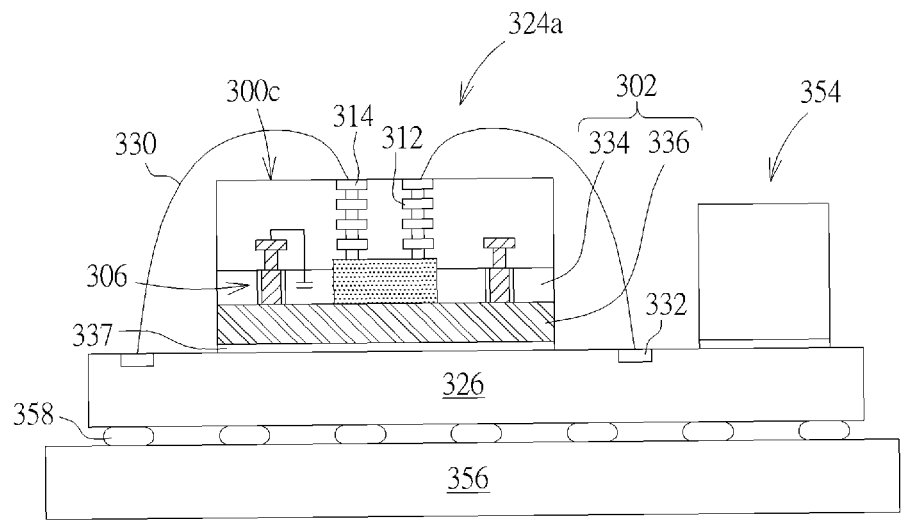

Please refer to FIG. 10, which shows a schematic diagram of the semiconductor structure having a shielding structure according to one embodiment of the present invention. In the present embodiment, the semiconductor structure uses wire bonding instead of TSV to transfer the voltage signal. As shown in FIG. 10, the package body 324a includes a chip 300c, a base board 326, another chip 354 and a board 356. The RF circuit 304 is connected to the contact pad 332 of the base board 326 by the connection unit 312 and the wire 330. In this embodiment, the original base layer 338 in the SOI substrate can be removed by a thinning process or other method. In the package body 324a, the insulation layer 336 may directly contact the base board 326, or can be attached on the base board 326 by an adhesive 337. It is understood that besides the wire bonding, other package method can be used in the package body 324a, such as the solder bump or the RDL layer, so as to provide the voltage signal. However, it is preferably that those connections are disposed at the side of the active surface 301 of the substrate 302.

Figure 11:
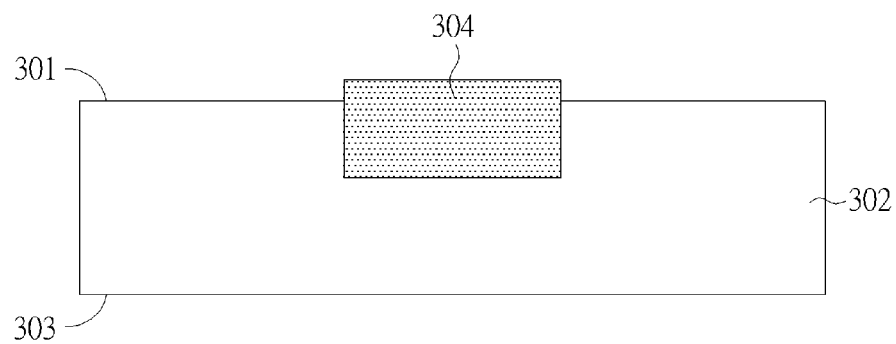
FIG. 11 to FIG. 17 show schematic diagrams of the method for forming the semiconductor structure having a shielding structure according to other embodiments of the present invention.
Figure 12:
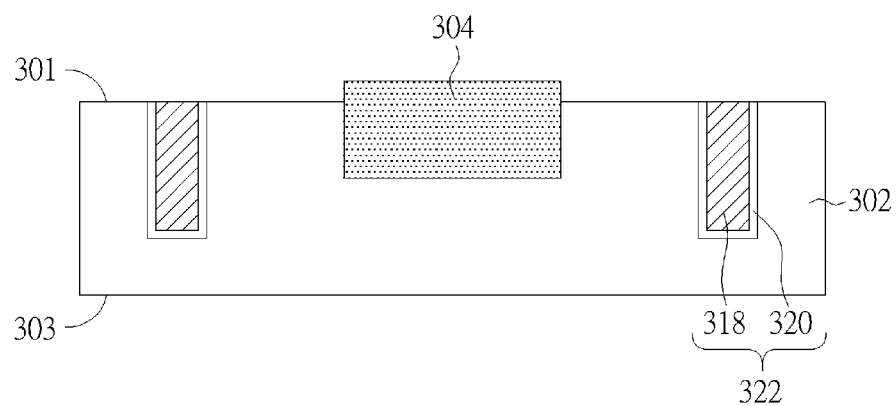

Please refer to FIG. 11 and FIG. 12, and further in conjunction with FIG. 2 and FIG. 7, which are schematic diagrams of the method for forming the semiconductor structure having a shielding structure according to other embodiments of the present invention. As shown in FIG. 11, a substrate 302 is provided, following by forming an RF circuit 304 on the active surface 301 of the substrate 302. Subsequently, as shown in FIG. 11, a shielding TST 322 is formed on the active surface 301 of the substrate 302. The method for forming the shielding TST 322 includes forming an opening (not shown) on the active surface 301 and then filling an insulation layer 320 and a conductive layer 318 into the opening. It is noted that in another embodiment, the shielding TST 322 can be formed before forming the RF circuit 304. Then, a plurality of dielectric layers 316 and a metal interconnect system 308 including a connection unit 312, a contact pad 314 and an optional shielding unit 310 are formed on a side of the active surface 301. Therefore, the semiconductor structure in FIG. 2 can be obtained. It is noted that, since the shielding TST 322 does not penetrate through the substrate 302, so the method in the present embodiment does not require an additional thinning process toward the back surface 303 of the substrate 302. Next, a packaging method can be further performed to form the package body 326 in FIG. 6.

Figure 13:
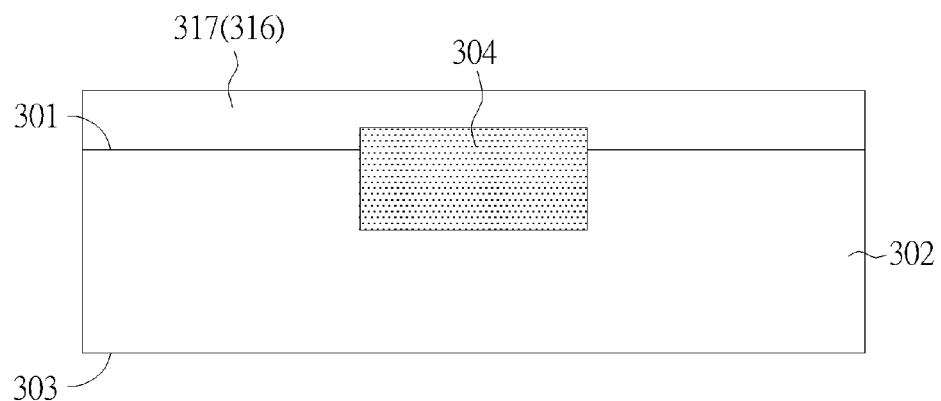
Figure 14:
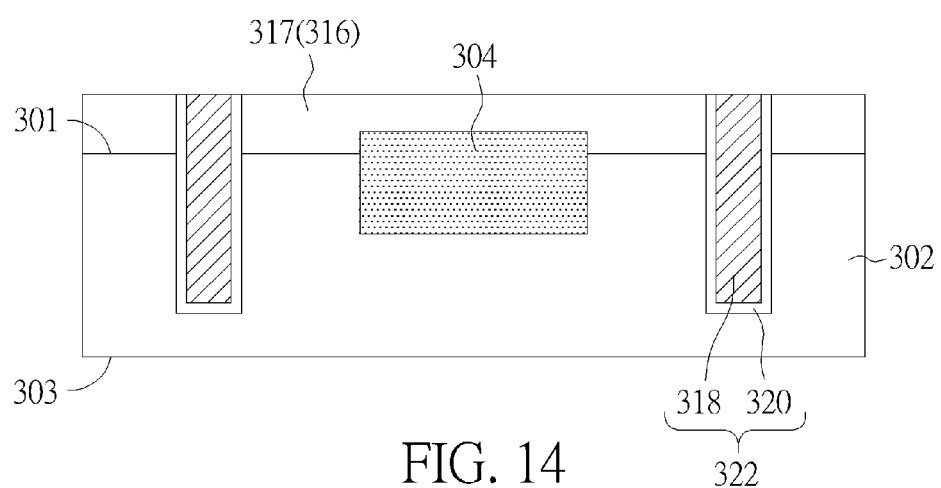

The method for forming the semiconductor device is not limited to the abovementioned "via first" process, but can be a "via middle" process. For example, after forming the structure in FIG. 11, please see FIG. 13. A part of the dielectric layer 316 such as an ILD layer 317 is formed on the active side 301 of the substrate 302. As shown in FIG. 14, a shielding TST 322 is formed in the ILD layer 317 and the substrate 302 to penetrate therethrough. Other dielectric layer 316 and a metal interconnection system 308 are formed. The structure in FIG. 3 is therefore provided. Subsequently, a package process can be carried out.

In another embodiment, to form the chip 300a in FIG. 8, the step in FIG. 11 to FIG. 12 and FIG. 2 can be first carried out. After forming the metal interconnection system 308, a thinning process can still be performed to expose the TSV for connection 344 but does not expose the shielding TST 322.

When using the SOI substrate, the forming method can have different embodiments. Please see FIG. 15, a substrate 302 is provided. The substrate 302 includes a base layer 338, an insulation layer 336 and a semiconductor layer 334. Then an RF circuit 304 and a shielding TST 322 are formed in the semiconductor layer 334, in which the forming sequence thereof can be arranged. As shown in FIG. 16, a plurality of dielectric layers 316 and a metal interconnect system 308a including a connection unit 312a, and an optional shielding unit 310 are formed on a side of the active surface 301. Then, a thinning process is performed from a back surface 303 of the substrate 302 to reduce the thickness of the substrate 302. Finally, a TSV for connection 344 is formed on the back surface 303. The method for forming the TSV for connection 344 includes forming an opening (not shown) on the back surface 303 and then filling an insulation layer 340 and a conductive layer 342 into the opening. Thereafter, the structure in FIG. 9 can be obtained. It is understood that the method in this embodiment can applied to the via middle method, which forms a part of the dielectric layer 316 and then forms the shielding TST 322 such that the shielding TST 322 penetrates through a part of the dielectric layer 316 and the semiconductor layer 334 of the substrate 302.

Figure 15:
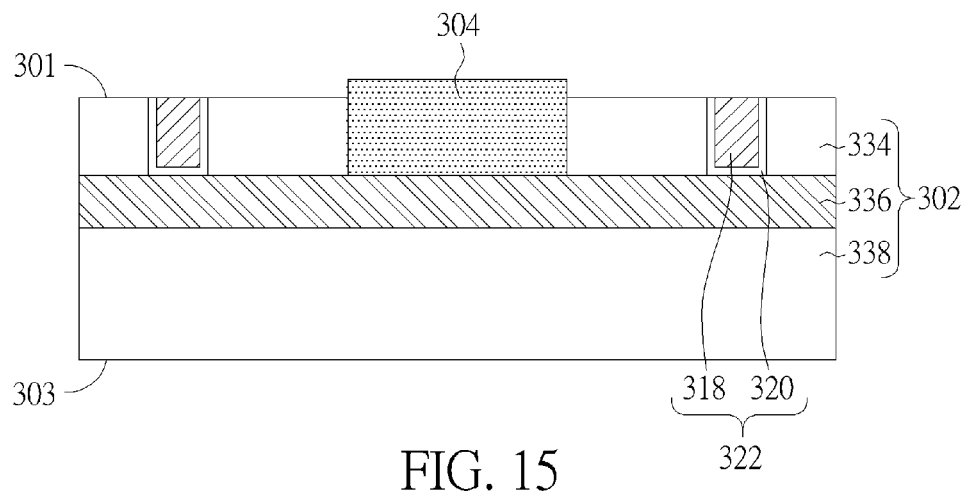
Figure 16:
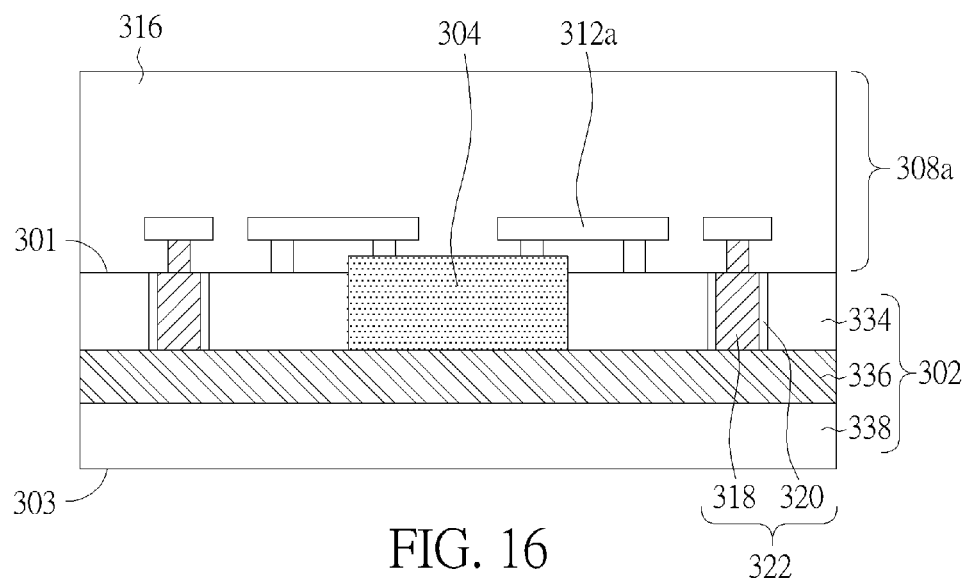
Figure 17:
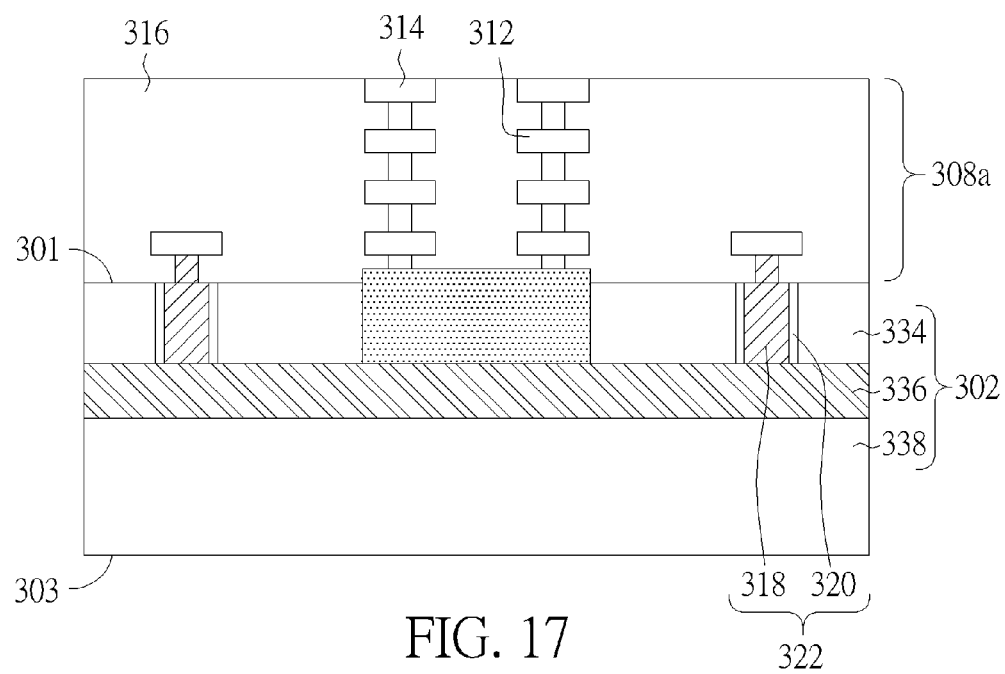

In another embodiment, after the step in FIG. 15, please see FIG. 17. A plurality of dielectric layers 316 and a metal interconnect system 308 including a connection unit 312, a contact pad 314 and an optional shielding unit 310 are formed on a side of the active surface 301. Then, a thinning process is performed from a back surface 303 of the substrate 302 to completely remove the base material 338. The chip 300c in FIG. 10 can therefore be obtained. A packaging method can be further performed to form the package body 324a.

In summary, the present invention provides a semiconductor device having a shielding structure, which can effectively eliminate the phenomenon of EMI from the RF circuits. The present invention further provides a variety of embodiments by incorporation into other TSV and SOI substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device with a shielding structure, comprising:
   a substrate, having an active surface and a back surface;
   a radio frequency (RF) circuit, disposed on the active surface of the substrate;
   a shielding structure disposed at least in the substrate, wherein the shielding structure encompasses the RF circuit and is grounded, and the shielding structure comprises a shielding through silicon trench (TST) that does not penetrate through the substrate;
   a metal interconnection system disposed on a side of the active surface, wherein the metal interconnection system comprises a connection unit that provides a voltage signal to the RF circuit; and
   a through silicon via (TSV) for connection disposed in the substrate, wherein the TSV for connection penetrates through the substrate, and the TSV for connection is electrically connected to the RF circuit through the connection unit, wherein the TSV for connection is disposed between the shielding TST and the RF circuit, and the shielding TST surrounds the TSV for connection.

2. The semiconductor device with the shielding structure according to claim 1, wherein the metal interconnection system further comprises a shielding unit, and the shielding structure comprises the shielding unit.

3. The semiconductor device with the shielding structure according to claim 2, wherein the shielding unit is electrically connected to the shielding TST.

4. The semiconductor device with the shielding structure according to claim 1, wherein from a top view of the semiconductor device, the shielding TST is a closed polygon.

5. The semiconductor device with the shielding structure according to claim 1, wherein from a top view of the semiconductor device, the shielding TST is a polygon having an opening.

6. The semiconductor device with the shielding structure according to claim 5, wherein the semiconductor device is a chip, and from a top view of the semiconductor device, there is no circuit disposed between the opening and the closest edge of the substrate to the opening.

7. The semiconductor device with the shielding structure according to claim 5, wherein the semiconductor device is a package body, the substrate, the RF circuit, the shielding structure and the metal interconnection system are in a chip that is within the package body, and from a top view of the semiconductor device, there is no other chip disposed between the opening and the closest edge of the package body to the opening.

8. The semiconductor device with the shielding structure according to claim 1, wherein the semiconductor device is a package body, and the package body further comprises a base board, which is electrically connected to the connection unit by a wire, a solder bump or a redistribution layer.

9. The semiconductor device with the shielding structure according to claim 8, wherein the wire, the solder bump or the redistribution layer are disposed on a side of the active surface of the substrate.

10. The semiconductor device with the shielding structure according to claim 8, wherein the substrate sequentially comprises an insulation layer and a semiconductor layer disposed on the insulation layer.

11. The semiconductor device with the shielding structure according to claim 10, wherein there is not any semiconductor material between the base board and the insulation layer.

12. A semiconductor device with a shielding structure, comprising:
    a substrate sequentially having a back surface, a base material, an insulation layer, a semiconductor layer and an active surface;
    a radio frequency (RF) circuit disposed in the semiconductor layer;
    a shielding structure disposed at least in the semiconductor layer, wherein the shielding structure encompasses the RF circuit and is grounded, and the shielding structure comprises a shielding through silicon trench (TST) that penetrates through the semiconductor layer but does extend into the insulation layer; and
    a through silicon via (TSV) for connection penetrating through the base material, the insulation layer and the semiconductor layer, wherein the TSV for connection provides a voltage signal to the RF circuit.

13. The semiconductor device with the shielding structure according to claim 12, further comprising a metal interconnection system disposed on a side of the active surface of the substrate, wherein the metal interconnection system further comprises a shielding unit, and the shielding structure comprises the shielding unit.

14. The semiconductor device with the shielding structure according to claim 13, wherein the shielding unit is electrically connected to the shielding TST.

15. The semiconductor device with the shielding structure according to claim 12, wherein from a top view of the semiconductor device, the shielding TST is a closed polygon.

16. The semiconductor device with the shielding structure according to claim 12, wherein from a top view of the semiconductor device, the shielding TST is a polygon having an opening.

17. The semiconductor device with the shielding structure according to claim 16, wherein the semiconductor device is a chip, and from a top view of the semiconductor device, there is not any circuit disposed between the opening and the closest edge of the substrate to the opening.

18. The semiconductor device with the shielding structure according to claim 16, wherein the semiconductor device is a package body; the substrate, the RF circuit, the shielding structure and the TSV for connection are in a chip that is within the package body, and from a top view of the semiconductor device, there is no other chip disposed between the opening and the closest edge of the package body to the opening.

19. The semiconductor device with the shielding structure according to claim 12, wherein a ratio of a thickness of a connection conductive layer in the TSV for connection to a width of the TSV for connection is less than that of a thickness of a shielding conductive layer in the shielding TST to a width of the shielding TST.

* * * * *